(12) United States Patent
Yamaguchi et al.

(10) Patent No.: US 12,568,679 B2
(45) **Date of Patent: *Mar. 3, 2026**

(54) CONTACT STRUCTURES IN RC-NETWORK COMPONENTS

(71) Applicant: Murata Manufacturing Co., Ltd., Nagaokakyo (JP)

(72) Inventors: Yohei Yamaguchi, Nagaokakyo (JP); Yasuhiro Murase, Nagaokakyo (JP); Stéphane Bouvier, Cairon (FR)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 498 days.

This patent is subject to a terminal disclaimer.

(21) Appl. No.: 17/935,296

(22) Filed: Sep. 26, 2022

(65) Prior Publication Data

US 2023/0017133 A1 Jan. 19, 2023

Related U.S. Application Data

(63) Continuation of application No. PCT/IB2021/052533, filed on Mar. 26, 2021.

(30) Foreign Application Priority Data

Mar. 26, 2020 (EP) .................................... 20305347

(51) Int. Cl.

*H10D 84/00* (2025.01)
*H10D 1/66* (2025.01)
*H10D 86/85* (2025.01)

(52) U.S. Cl.

CPC .......... *H10D 84/206* (2025.01); *H10D 1/665* (2025.01); *H10D 86/85* (2025.01)

(58) Field of Classification Search

CPC ...... H10D 84/206; H10D 1/665; H10D 86/85; H10D 1/47

See application file for complete search history.

(56) References Cited

U.S. PATENT DOCUMENTS 7,738,226 B2 6/2010 Berberich et al.
10,586,774 B2 * 3/2020 Shimoichi .............. H05K 1/029
(Continued)

FOREIGN PATENT DOCUMENTS

EP 3680934 A1 7/2020
WO 2015063420 A1 5/2015
WO 2018173275 A1 9/2018

OTHER PUBLICATIONS

International Search Report issued for PCT/IB2021/052533, date of mailing Jun. 16, 2021.

*Primary Examiner* — Steven B Gauthier
*Assistant Examiner* — Khatib A Rahman
(74) *Attorney, Agent, or Firm* — ArentFox Schiff LLP

(57) ABSTRACT

RC-network components that include a substrate having a capacitor with a thin-film top electrode portion at a surface at one side of the substrate. The low ohmic semiconductor substrate is doped to contribute 5% or less to the resistance of the RC-network component. The resistance in series with the capacitor is controlled by providing a contact plate, spaced from the top electrode portion by an insulating layer, and a set of one or more bridging contacts in openings in the insulating layer. The bridging contacts electrically interconnect the top electrode portion and contact plate. Different resistance values can be set by appropriate selection of the number of bridging contacts. Temperature concentration at the periphery of the openings is reduced by providing reduced thickness portions in the insulating layer around the periphery of the openings.

14 Claims, 12 Drawing Sheets

(56) References Cited

U.S. PATENT DOCUMENTS

| | | | | |
|---|---|---|---|---|
| 10,707,179 | B1 * | 7/2020 | Wu | H01L 21/76877 |
| 11,062,992 | B2 * | 7/2021 | Tanaka | H01L 23/5256 |
| 11,393,752 | B2 * | 7/2022 | Tanaka | H01L 23/5226 |
| 11,398,545 | B2 * | 7/2022 | Lin | H10D 1/696 |
| 11,658,174 | B2 * | 5/2023 | Fujiwara | H10D 1/692 257/533 |
| 2005/0179077 | A1 | 8/2005 | Schnitt | |
| 2007/0274014 | A1 * | 11/2007 | Berberich | H10D 84/204 257/E27.024 |
| 2010/0219502 | A1 | 9/2010 | Shieh et al. | |
| 2012/0012982 | A1 | 1/2012 | Korec et al. | |
| 2016/0087030 | A1 * | 3/2016 | Robutel | H03H 1/00 438/387 |
| 2016/0268144 | A1 | 9/2016 | Voiron et al. | |
| 2019/0148370 | A1 | 5/2019 | Hung et al. | |
| 2020/0098634 | A1 | 3/2020 | Tsunami | |
| 2020/0273796 | A1 * | 8/2020 | Murase | H10D 1/47 |

* cited by examiner

CONTACT STRUCTURES IN RC-NETWORK COMPONENTS

CROSS REFERENCE TO RELATED APPLICATIONS

The present application is a continuation of International application No. PCT/IB2021/052533, filed Mar. 26, 2021, which claims priority to European Patent Application No. EP20305347.5, filed Mar. 26, 2020, the entire contents of each of which are incorporated herein by reference.

FIELD OF THE INVENTION

The present invention relates to integrated RC-network components and, in particular, to contact arrangements in integrated RC-network components as well as to methods of their manufacture.

TECHNICAL BACKGROUND

Many electrical circuits require connection to an RC network (i.e. connection to a resistor and a capacitor that are connected in series to one another). For example, in a power electronics device a damping RC network is connected in parallel with a switch or reactance and used as a “snubber” to prevent or attenuate voltage transients (spikes) caused by rapid changes in current, to damp oscillations or overshoot due to inductive load switching, and so on. Typically, the voltage transients handled by snubbers are generated by reactances in a power circuit. The reactances may be parasitic.

RC networks can be implemented in various ways. One conventional approach for implementing an RC network consists in soldering a discrete resistor and a discrete capacitor onto a printed circuit board. A disadvantage of this first approach is that the discrete components occupy a large surface area on the mounting board. Another disadvantage is the high inductive parasitics that arise with such an arrangement.

A second approach consists in integrating an RC network with an active circuit (e.g. a power transistor) to be snubbed. In the context of automotive applications, such as fully electrical and hybrid cars, integrated RC snubbers are used to suppress electrical oscillations induced by inductive load switching (e.g. electrical motor control). These applications generate high combined constraints on this kind of component, notably: ability to withstand high temperature, ability to withstand high voltage, ability to withstand high currents, high reliability, low thickness, good thermal conductivity, and low inductive parasitic (ESL). However, implementing integrated capacitors and resistors using regular 2D (planar) semiconductor technology has not been able to satisfy all the combined constraints discussed above, mainly because of the inability of this technology to provide the necessary high capacitance density (F/mm$^2$) in combination with the ability to withstand the necessary high operating voltage.

US2012/0012982 describes a stand-alone (monolithic) component including a 3D capacitor formed in a top surface of a substrate. A resistor may be provided in series with the 3D capacitor by setting the resistivity of the substrate to a value which makes the substrate itself constitute the desired series resistor. Contacts to the RC-network are taken at the top of the substrate (where a contact plate is laminated on the top electrode of the 3D capacitor) and at the bottom of the substrate (where a backside metallization is provided).

The latter component has a number of disadvantages. Firstly, in order to provide a range of RC-network components taking a range of values for resistance it would be necessary to employ substrates having a wide range of thicknesses and/or to employ substrates having a wide range of resistivity values. Neither of these options is acceptable in practical terms. Secondly, with current manufacturing techniques it is difficult to set the substrate’s properties sufficiently precisely to guarantee a desired resistance value for the finished component. Additionally, in cases where the substrate provides appreciable resistance there can be difficulties in forming the backside metallization. Finally, in this component the resistance value is liable to change significantly with temperature.

In the applicant’s co-pending European patent application EP 19 305 026.7, the whole contents of which are incorporate herein by reference, a new RC-network component has been proposed having design features that are adapted to allow a plurality of the above-mentioned combined constraints to be satisfied simultaneously. FIGS. 1A to 1C illustrate schematically the general structure of one type of integrated RC snubber described in EP 19 305 026.7, and FIGS. 1D and 1E illustrate two other types of integrated RC-network component that are also described in EP 19 305 026.7. FIG. 1F illustrates an additional structure that can be sued for an integrated RC component.

As illustrated in FIG. 1A, the RC-network component 1 has a substrate 2. At one side 2*a* of the substrate 2, a three-dimensional (3D) capacitor is provided comprising a dielectric layer 4 formed over a set of wells in the substrate material. A conductive material is provided over the dielectric layer 4 and has a portion 6 inside the wells as well as a plate portion 7 extending over the surface of the substrate at side 2*a*. The plate portion 7 constitutes the top electrode of the 3D capacitor. The top electrode of the capacitor may, for example, by made of polysilicon. An insulator layer 10 is formed over the plate portion/top electrode 7. A set of bridging contacts 8 are provided in openings 11 through the insulator layer 10. A conductive top plate 9 is provided over the insulator layer 10. The bridging contacts 8 provide a conduction path for electric current between the capacitor electrode 7 and the top plate 9.

In the example illustrated in FIG. 1A, the substrate 2 serves as the lower electrode of the 3D capacitor. A backside metallization layer 12 is provided on the substrate 2 at the side 2*b* thereof opposite to side 2*a*. Accordingly, the RC-network component 1 is a so-called “vertical” component with one contact to the series RC circuit being made on side 2*a* of the substrate, via the top plate 9, and the other contact being made on side 2*b*, via the backside metallization 2*b*.

FIG. 1B is an equivalent circuit diagram representing the components of the RC-network component illustrated in FIG. 1A in the case where the substrate 2 is a low ohmic (highly doped) substrate. More particularly, the substrate 2 can be configured as a low ohmic substrate such that it contributes only a small percentage (say, no more than 5% or so) of the overall resistance of the integrated RC-network component 1. The value of the overall resistance of the component is then controlled almost completely by the capacitor electrode 7 and its contact arrangement to the top plate 9. Notably, the resistance value can be adjusted via the design of the contact arrangement connected to the capacitor electrode 7, for instance by changing the number, dimensions and positioning of the bridging contacts. FIG. 1C is a perspective view of an example in which there are nine bridging contacts 8 interconnecting the thin-film capacitor electrode portion 7 and the top plate 9, and the bridging contacts are evenly distributed across the surface of the electrode 7.

In the RC-network component 1 illustrated in FIGS. 1A-1C the capacitor in the RC network is a 3D capacitor and a low ohmic substrate constitutes the bottom electrode of the capacitor. By making use of 3D capacitors (e.g. trench capacitors, or capacitors comprising dielectric and electrode layers formed over pillars/columns) the above-described integrated RC-network component can have a merit factor Capacitance Density*Breakdown Voltage that is be improved by a ratio of more than fifty compared to earlier proposals. However, other technologies may be used to implement the capacitor. Thus, for example, in the RC-network component 11 illustrated in FIG. 1D a 3D capacitor is made by depositing layers of a MIM (metal-insulator-metal) stack in the pores of a porous anodic oxide region 17 provided in a metal layer (not shown). The lower metal layer of the MIM stack is designated 13 in FIG. 1D, the insulator layer is designated 14 and the top metal layer is designated 15. Incidentally, the MIM stack may have a repeating layer structure (e.g. MIMIM, MIMIMIM, etc.).

As an example, the metal layer may be an aluminium layer and the anodic oxide may be aluminium oxide made by anodization of a selected region in the aluminium layer. The pores of the anodic oxide region 17 may extend all the way through the metal layer so that the inside of each pore communicates with an underlying conductive layer 16. In certain implementations, the conductive layer 16 and the overlying metal layer are formed on a substrate 19 before the anodization process is performed. To enable the bottom terminal of the RC-network component 11 to be provided at the bottom of the structure, a conductive layer 12, serving as the bottom contact, may be provided and electrical contact between the bottom electrode of the 3D capacitor is achieved via a conductor 18 passing through the substrate 19. If desired, lateral isolation bands (not shown), made of electrically-insulating material, may be provided through the conductive layer 16, and this facilitates the integration of additional components in the device, either to the left and/or right sides of the 3D capacitor illustrated in FIG. 1D, or in additional layers above or below the illustrated structure. Further information regarding how to fabricate a 3D capacitor in the pores of a porous anodic oxide region, and regarding techniques for integration of additional components, may be found in the Applicant's earlier application EP 3 063 789.

As another example of variation in the design of the capacitor, FIG. 1E illustrates an RC-network component 21 in which the capacitor is a planar capacitor having a bottom electrode 27 formed on the substrate 2, a dielectric layer 4*a* and a top electrode layer 7. A first contact to the series RC component is made on side 2*a* of the substrate, via the top plate 9, and the other contact to the series RC component may be made through the substrate, for example on side 2*b* via a backside metallization (not shown).

The example illustrated in FIG. 1F illustrates a structure similar to that of FIG. 1A but configured as a so-called "horizontal" component in which both contacts to the RC component are both provided on the same side of the substrate. A first contact to the series RC circuit is made on side 2*a* of the substrate, via the top plate 9, and the other contact is made through the substrate 2, also on side 2*a* of the substrate, at a contact 12'.

The components illustrated in FIGS. 1D-1F make use of distributed bridging contacts 8 and a contact plate 9 so as to set the resistance of the overall RC-network component to a desired value, as in the RC-network component 1 of FIGS. 1A-1C.

An explanation shall now be given, with reference FIGS. 2A to 2C, regarding how the use of the contact structure involving the contact plate 9 and the set of bridging contacts 8 enables the resistance of the above-described RC-network components 1, 11, 21 to be adjusted. For the purposes of the discussion of FIGS. 2A-2C, it is assumed that the capacitor-electrode portion 7 has a square peripheral shape.

When the electrical properties of a thin film or plate of material are discussed it is common to refer to the sheet resistance of the film/plate. As is well known, the sheet resistance of a material is a quantity that is quoted in Ohms per square, and the electrical resistance of a sheet of a specific material is calculated according to the following relation:

$$R = R_s \frac{L}{W}$$

where R is the electrical resistance provided by the sheet, Rs is the sheet resistance of the material forming the sheet, L is the length of the sheet and W is the width of the sheet. Thus, it can be understood that, provided that different sheets of a specific material are all square (i.e. L/W=1), these sheets will all have the same electrical resistance, irrespective of whether the sheets are of the same size. The RC-network components of FIGS. 1A-1E exploit this property.

FIG. 2A illustrates a simplified electrical model of the capacitor electrode portion 7 (made of resistive polysilicon), in which Rsq_poly represents the sheet resistance of this polysilicon thin film 7. Rsq_poly is a function of the resistivity of the material, and of its thickness.

FIG. 2B then represents a very simplified electrical model of the case where the capacitor and a single metal contact are added to FIG. 2A. It can be understood that the resistive access to the capacitor (or equivalent series resistance, ESR) is a function of the sheet resistance of the polysilicon layer 7, i.e. ESR=f (Rsq_poly).

However, if the number of contacts is increased to a number N, as illustrated by the simplified electrical model of FIG. 2C, the polysilicon thin film 7 is notionally sub-divided into N smaller polysilicon squares sheets each having the same resistance value. If the N contacts are then connected together by a very low resistive plate (metal plate), i.e. the contact plate 9, the N smaller polysilicon squares will be virtually connected in parallel. Accordingly, the ESR becomes a function of the sheet resistance of layer 7 divided by the number N of bridging contacts 8, i.e. ESR=f (Rsq_poly/N).

Thus, the resistance of an RC-network component as illustrated in FIGS. 1A-E can be adjusted by varying the number N of bridging contacts interconnecting the contact plate 9 to the capacitor-electrode layer 7. This can be easily realized by adding the isolation layer 10 (e.g. made of $SiO_2$) between the two layers 7, 9 and performing a simple patterning process to form holes in which the bridging contacts can be provided.

The above analysis is applicable in cases where the top plate-shaped electrode 7 of the capacitor is a thin film, that is, the thickness of the top plate-shaped electrode 7 is much less that the length of the bridging contacts. Typically, in an RC-network component as illustrated in FIGS. 1A-E the thin-film plate-shaped capacitor top electrode is made of polysilicon and is less than 5 micrometers thick. In certain preferred embodiments of the invention the thin-film plate-shaped capacitor top electrode is made of polysilicon and is less than 1 micrometer thick.

RC-network components as illustrated in FIGS. 1A-F provide a number of advantages, such as:

- Ability to withstand high currents (several amps or tens of amps): the inrush current is divided between the N contacts. Furthermore, there is a quasi-vertical current path in the thin capacitor-electrode layer 7.
- Ability to withstand significant voltage levels (several tens or hundreds of volts).
- Small footprint: the surface area occupied by the component is small irrespective of the resistor value.
- Low thickness: the thickness of the RC-network component can be as low as that of a power transistor (e.g. 50 μm) and the thickness does not need to change as the resistance value changes.
- A variety of resistance values can be achieved using just one value for wafer resistivity (preferably, highly doped) simply by changing the contact arrangement at the top of the substrate.
- Low process overhead for resistance variability: the resistance value may be programmed simply by 1 mask modification (contact opening).
- Versatile wiring arrangements: wiring is possible on the 4 sides of the architecture.
- Low temperature drift of the resistance (of the order of a few 100 s of ppm/K. This is a significant consideration for RC-network components that are applied as snubber networks, because snubbers absorb energy during operation, heat up, and often need to withstand relatively large temperature ranges, for example from room temperature up to around 200° C.).
- A well-controlled resistance value of the resistor included in the RC network (<10% variation from the target value).
- Standard processes can be used for backside metallization (in the case of using a highly-doped silicon substrate).
- In cases where the RC-network components constitute RC snubbers:
  - there is a good response of the snubber network to signals which have fast rise times, and
  - the contact layout facilitates low inductivity connection of the snubber to the circuit being snubbed, thus avoiding decoupling of the snubber's resistor by parasitic inductance of the interconnection line.

The resistance value could also be changed by changing the dimensions (cross-sectional area, length) of the bridging contacts. However, typically the dimensions of the bridging contacts are set based on the desired current-handling capacity of the device, and then the resistance value is set by selecting an appropriate number of bridging contacts. Likewise, the resistance value could be changed by changing the dimensions of the contact plate 9. However, in general, the dimensions of the contact plate 9 are set in view of constraints relating to assembly.

In principle the locations of the bridging contacts 8 could be distributed over the surface area of the thin-film top electrode 7 of the capacitor in an uneven manner. This would have only a small impact on the resistance value observed at low frequencies. However, at higher frequencies such an uneven distribution of the bridging contacts 8 could lead to unpredictable variation in the value of resistance. In contrast, consistent frequency behavior is observed in the case where the bridging contacts 8 are provided at locations that are evenly distributed over the surface area of the thin-film top electrode of the capacitor. Thus, for example, the area of the top electrode may be notionally divided up into squares and bridging contacts 8 may be positioned, respectively, at the centers of the squares. However, other even distributions may be used, for example, the bridging contacts may be positioned on concentric circles, evenly spaced from each other.

It has been found that an undesired temperature-concentration phenomenon may occur during use of the integrated RC-network components illustrated in FIGS. 1A to 1F, in the case where a current surge takes place. This phenomenon will now be described with reference to FIGS. 3A and 3B.

It has been observed that when a power pulse is applied to a contact arrangement such as that at the top of the components illustrated in FIGS. 1A to 1F, wherein bridging contacts in small openings interconnect a capacitor top electrode to an upper plate, the periphery of the opening heats up to a high temperature and the component may fail.

FIGS. 3A and 3B serve to illustrate the results of simulations that were performed to estimate the transient temperature rise at the periphery of the openings in a case where a rectangular wave is applied. These simulations modelled temperature rise in a structure including a lower layer (corresponding to the thin-film top electrode portion) connected to a metal upper plate by a set of four bridging contacts. The simulations involved a transient thermal analysis performed using the finite element method. The simulations modelled the case where a rectangular wattage pulse having a peak power level of 2000 W and a duration of 150 ns was applied to the structure illustrated in FIG. 3A in which each bridging contact had a square cross-sectional shape.

The example illustrated by FIGS. 3A-3B concerns an RC-network component of the same general type as that illustrated in FIG. 1A. In this example, the substrate 2 is made of Si doped to have resistivity in the range 1 to 5 mΩ·cm. The capacitor dielectric layer 4 is made of ONO (i.e. a layered structure formed of $SiO_2$/SiN/$SiO_2$). The capacitor top electrode is made of polysilicon. The insulator layer 10 is made of $SiO_2$. The bridging contacts 8 and the top plate 9 are made of Al—Si—Cu. The component also includes an additional layer 22 made of SiN which serves to improve moisture resistance. If desired, additional layers may be provided in the structure, for example an additional $SiO_2$ layer may be provided underneath the layer 22.

During a transient surge the inrush current is divided between the bridging contacts and then spreads horizontally in all directions in the portion of the capacitor-electrode layer 7 connected to each bridging contact, as illustrated by the arrows marked in FIG. 3A. However, it has been found in the simulations that there is a concentration of current at the periphery of the openings in the insulator layer 10 through which the bridging contacts 8 pass, at the locations marked by crosses, and this can lead to significant undesired heating.

FIG. 3B illustrates the results of a simulation that was performed in relation to an example contact arrangement in which four bridging contacts 8 were provided to interconnect the thin-film capacitor-electrode portion 7 to the top plate 9. In the example, each bridging contact 8 had a square cross-sectional shape, and the four bridging contacts were distributed evenly across the surface of the top plate 9.

As can be seen from FIG. 3B, the temperature in the vicinity of each bridging contact can become extremely high. Indeed, a maximum temperature of 348° C. was reached at the corners of each bridging contact (in other words, at the corners of each square opening through the insulating layer 10). Such high temperatures could damage or destroy the RC-network component during use.

In order to ensure that the RC-network component is not damaged or destroyed during use, because of such high temperatures, it can be contemplated to increase the diameter of the openings 11 in the insulating layer 10. However, this leads to a reduction in the resistance of the RC-network component and often it is desirable to be able to maintain a high value for the RC-network component's resistance. Another possible approach would be to change the cross-sectional shape of the bridging contacts (this approach is proposed in the applicant's co-pending European patent application also entitled "Contact structures in RC-network components").

Another possible approach would be to reduce the thickness of the insulating layer through which the bridging contacts pass. The results of implementing such an approach will be described with reference to FIGS. 4A-5B, which relate to simulations that were performed in relation to a structure including a lower layer (corresponding to the thin-film top electrode portion) made of polysilicon and having a thickness of 840 nm, connected to a metal upper plate by a set of four bridging contacts each having circular cross-section and a diameter of 120 μm, through an insulating layer made of $SiO_2$, as illustrated in FIG. 4A. The simulations modelled results obtained upon application to the FIG. 4A structure of a power pulse illustrated in FIG. 4B.

FIG. 5A illustrates how the temperature at the periphery of the openings changed upon application of the voltage pulse in two different cases, namely: in a first example where the insulating layer was 1 μm thick, and in a second example where the thickness of the insulating layer was reduced to 0.1 μm thick. It can be seen from FIG. 5A that the maximum temperature at the periphery of the openings is considerably reduced by reducing the thickness of the insulating layer through which the bridging contacts pass. However, this affects the performance of the structure, in terms of stability of the resistance value, as shall be explained below.

FIG. 5B illustrates how the resistance of the structures according to the two examples in FIG. 5A, as well as two additional examples having intermediate values for the thickness of the insulating layer, changed with the frequency of applied signals. It can be seen from FIG. 5B that the threshold frequency at which the resistance value begins to decrease is significantly affected by the thickness of the insulating layer. More particularly, the frequency range over which the resistance value is stable decreases as the thickness of the insulating layer decreases. However, it is desirable for an RC component to have a resistance value that is stable over a wide frequency range.

The present invention has been made in the light of the problems discussed above.

SUMMARY OF THE INVENTION

The present invention provides an integrated RC-network component comprising: a substrate; a capacitor having a thin-film top electrode portion at a surface on a first side of the substrate; an insulating layer provided on the thin-film top electrode portion of the capacitor; a contact plate provided on the insulating layer; and a set of bridging contacts provided in openings traversing the insulating layer, the bridging contacts electrically connecting the thin-film top electrode portion of the capacitor to the contact plate, wherein the insulating layer comprises reduced-thickness portions located around the perimeters of the openings, and in the reduced-thickness portions the thickness of insulating material provided on the thin-film top electrode portion is lower than the thickness of the remainder of the insulating layer.

It has been found that by thinning the insulating layer solely in the vicinity of the openings containing the bridging contacts results in reduction of the temperature concentration at the periphery of the openings. Accordingly, a desired high value of resistance can be obtained without undue temperature rises at the openings in the insulating layer when transient current surges occur through the RC-network component, whilst maintaining a stable resistance value over a wide range in operating frequency.

The insulating layer can have various different profiles in the vicinity of the periphery of the openings. In certain embodiments of the invention the insulating layer has a stepped shape at the periphery of the openings, due to the reduced-thickness portions. In certain other embodiments of the invention, the reduced-thickness portions have a tapered shape. The tapering portion may be truncated so that there is an abrupt decrease in the thickness of the insulating layer in the vicinity of the perimeter of the openings. In yet other embodiments of the invention, the reduced-thickness portions have a curved profile.

The equivalent series resistance at the first side of the substrate may be proportional to the sheet resistance of the thin-film top electrode portion divided by the number of bridging contacts in the case where, in the direction of the thickness of the thin-film top electrode portion of the capacitor, the length of the bridging contacts is sufficiently greater than the thickness of the thin-film top electrode portion. Accordingly, in such cases the ESR can be set by control of the number of bridging electrodes.

In some embodiments of the invention the thickness of the thin-film top electrode portion is less than 5 μm, or yet more preferably less than 1 μm.

In some embodiments of the invention the insulating layer is made of a silicon compound.

In some embodiments of the invention the bridging contacts are made of a material having conductivity greater than that of the material forming the top capacitor electrode. In some cases, the bridging contacts and the contact plate are integrally formed of the same material, which facilitates manufacture.

In certain embodiments of the invention, the thin-film electrode portion of the capacitor is made of polysilicon. In this case there is low variation in the resistance of the component as the temperature changes.

In certain embodiments of the invention, the contact plate and the top electrode portion of the capacitor have the same peripheral shape. In some cases, the contact plate and the top electrode portion of the capacitor have the same size.

In certain embodiments of the invention, the RC-network component (101) has first and second contacts provided, respectively, at said first side of the substrate and at a second side of the substrate opposite to said first side, the first contact comprises said contact plate, and a series RC circuit is constituted between the first and second contacts. In some such embodiments of the invention, the substrate is a low ohmic semiconductor substrate doped to make a contribution of no more than 5% to the resistance of the RC-network component. In such embodiments the resistance of the RC-network component is substantially set by the contact arrangement at the first side of the substrate. The resistance value can be set with a relatively high degree of precision by control of the contact arrangement at said first side of the substrate and there is relatively low change in the resistance value as temperature changes while also obtaining a high capacitance value.

In certain embodiments of the invention, the capacitor is a 3D capacitor, the substrate is a low ohmic substrate and electrical contact to the bottom electrode of the capacitor is made through the low ohmic substrate. In the case where contact to the bottom electrode of the capacitor is made through the substrate, the substrate makes a reduced contribution to the overall resistance of the RC-network component in the case where it is a low ohmic substrate. This enables control of the resistance of the RC-network component to be exercised primarily by control of the properties of the bridging contacts.

In certain embodiments of the invention, the only part of the capacitor top electrode to be located at said surface on the first side of the substrate is a single planar sheet constituting said thin-film top electrode portion.

The present invention further provides a method of fabricating an RC-network component, the method comprising: forming a capacitor having a thin-film top electrode portion at a surface on a first side of a substrate; forming an insulating layer on the thin-film electrode portion of the 3D capacitor; forming a set of plural bridging contacts traversing openings in the insulating layer; and forming a plate-shaped contact on the insulating layer, wherein the set of bridging contacts electrically connect the thin-film top electrode portion of the capacitor to the plate-shaped contact, and wherein the insulating layer comprises reduced-thickness portions located around the perimeters of the openings, and the reduced-thickness portions have lower thickness than the remainder of the insulating layer.

This fabrication method makes it possible to set the nominal resistance value of the RC-network component to a desired value, selected in a wide range, simply by choosing how many contacts to include in the set of bridging contacts, and a desired resistance value can be obtained while avoiding an undue temperature rise when a current surge occurs through the component and while maintaining stability of the resistance value over a wide range of operating frequencies.

According to embodiments of the invention, the logistical challenge involved in manufacturing components having different resistance values is greatly reduced. For example, in a case where the bridging contacts are formed by using a photolithographic process to create via holes in the insulating layer and then filling the via holes with a conductive material, the resistance value can be changed simply by swapping the mask used in the photolithographic process.

BRIEF DESCRIPTION OF THE DRAWINGS

Further features and advantages of the present invention will become apparent from the following description of certain embodiments thereof, given by way of illustration only, not limitation, with reference to the accompanying drawings in which:

FIGS. 1A-1F illustrate examples of an integrated RC-network component described in the applicant's co-pending European patent application EP 19 305 026.7, to which the present invention can be applied, in which: FIG. 1A represents a cross-section through an example of a first type of integrated RC-network component, FIG. 1B represents an equivalent circuit to the FIG. 1A structure, FIG. 1C shows a perspective view schematically illustrating an example arrangement of bridging contacts in the RC-network component of FIG. 1A, FIG. 1D illustrates an example of a second type of integrated RC-network component described in the applicant's co-pending European patent application EP 19 305 026.7, FIG. 1E illustrates an example of a third type of integrated RC-network component described in the applicant's co-pending European patent application EP 19 305 026.7, and FIG. 1F illustrates an example of a fourth type of integrated RC-network component;

FIGS. 3A and 3B illustrate a temperature-concentration phenomenon observed in RC-network components of the types illustrated in FIGS. 1A-1F, in which: FIG. 3A illustrates how current flows in an integrated RC-network component of the general type illustrated in FIG. 1A, and FIG. 3B illustrates the results of a simulation of the temperature exhibited in the vicinity of an example arrangement of bridging contacts in an RC-network component of the type illustrated in FIG. 3A;

FIGS. 4A and 4B are diagrams relating to experimental conditions used in certain simulations, in which: FIG. 4A illustrates a test structure using four circular openings (to house bridging contacts) used in the simulations, and FIG. 4B illustrates a wattage pulse (power pulse) used in the simulations;

FIGS. 5A and 5B illustrate the results of the simulations, in which: FIG. 5A is a graph showing how temperature at the periphery of openings in the test structure changed upon application of a voltage pulse as in FIG. 4B, and FIG. 5B illustrates how resistance exhibited by the test structure a varied with operating frequency as the thickness of the insulating layer was changed;

FIG. 8A-8C are diagrams for illustrating an embodiment of the invention in which there are reduced-thickness portions of the insulating layer at the periphery of the openings for the bridging contacts, and the reduced-thickness portions have a tapering shape, in which: FIG. 8A represents a cross-section through a portion of a test structure including an insulating layer having tapering reduced-thickness portions at the periphery of openings for bridging contacts, FIG. 8B shows a top plan view of the test structure, and FIG. 8C is a graph of simulation results showing how the temperature developed at the periphery of openings in the test structure of FIGS. 7A and 7B changed upon application of a voltage pulse;

FIG. 9A-9C are diagrams for illustrating an embodiment of the invention in which there are reduced-thickness portions of the insulating layer at the periphery of the openings for the bridging contacts, and the reduced-thickness portions produce a stepped shape at the edges of the insulating layer adjacent to the openings, in which: FIG. 9A represents a cross-section through a portion of a test structure including an insulating layer having a stepped profile due to reduced-thickness portions at the periphery of openings for bridging contacts, FIG. 9B shows a top plan view of the test structure, and FIG. 9C is a graph of simulation results showing how the temperature developed at the periphery of openings in the test structure of FIGS. 9A and 9B changed upon application of a voltage pulse;

FIGS. 12A-12C illustrate additional examples of possible shapes of the reduced-thickness portion of the insulating layer, in which: FIG. 12A illustrates reduced-thickness portions having a multi-step profile, FIG. 12B illustrates reduced-thickness portions having a truncated tapering profile, FIG. 12C illustrates reduced-thickness portions having a tapering shape with a concavely-curved profile and a hollowed/undercut portion.

DETAILED DESCRIPTION OF EXAMPLE EMBODIMENTS

The present inventors have determined a way of mitigating the above-described undesired temperature-concentration phenomenon that may occur during use of the integrated RC-network components illustrated in FIGS. 1A-1F. More particularly, the inventors have determined that the transient temperature rise that is seen when a current surge passes through such RC-network components can be decreased by configuring the insulating layer so that it has reduced-thickness portions adjacent to the openings containing the bridging contacts.

The effectiveness of such reduced-thickness portions in reducing the severity of the above-mentioned temperature-concentration phenomenon discussed above will now be discussed with reference to FIGS. 6-9C.

Figure 6:
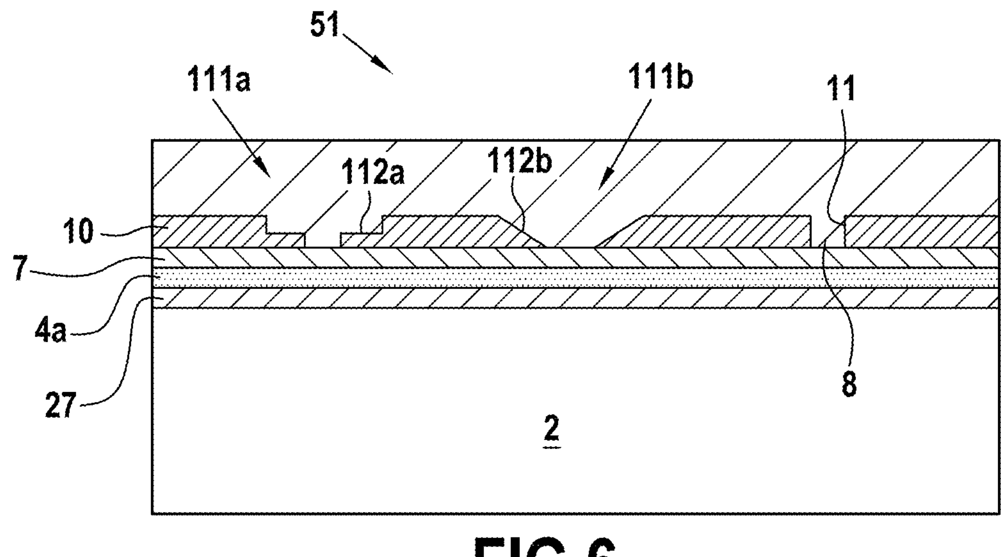
FIG. 6 illustrates an RC-network component comprising three different shapes for the portions of the insulating layer adjacent to openings for bridging contacts, including shapes implementing embodiments of the invention.

FIG. 6 schematically illustrates, in cross-section, an RC-network component 51 to which the present invention may be applied and show three different profiles for portions of the insulating layer that are adjacent to the openings housing the bridging contacts.

Figure 1C:
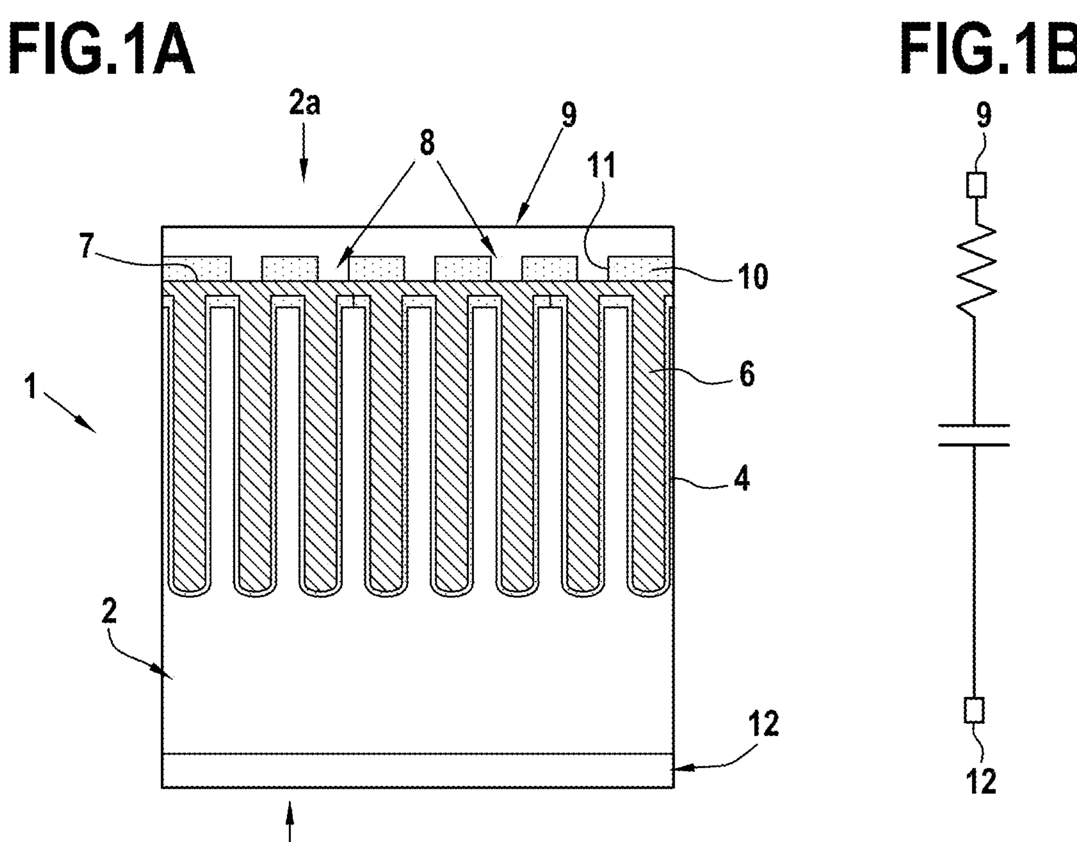
Figure 1C:
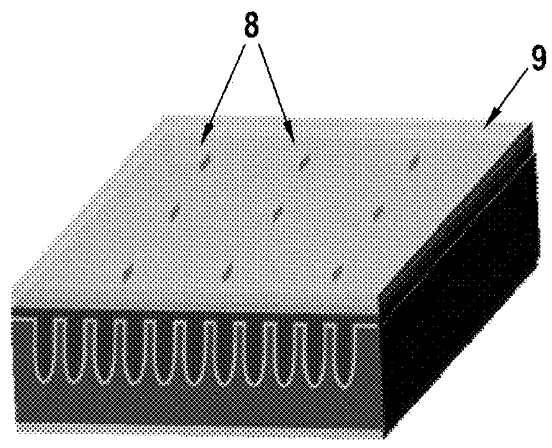
Figures 1D, 1E:
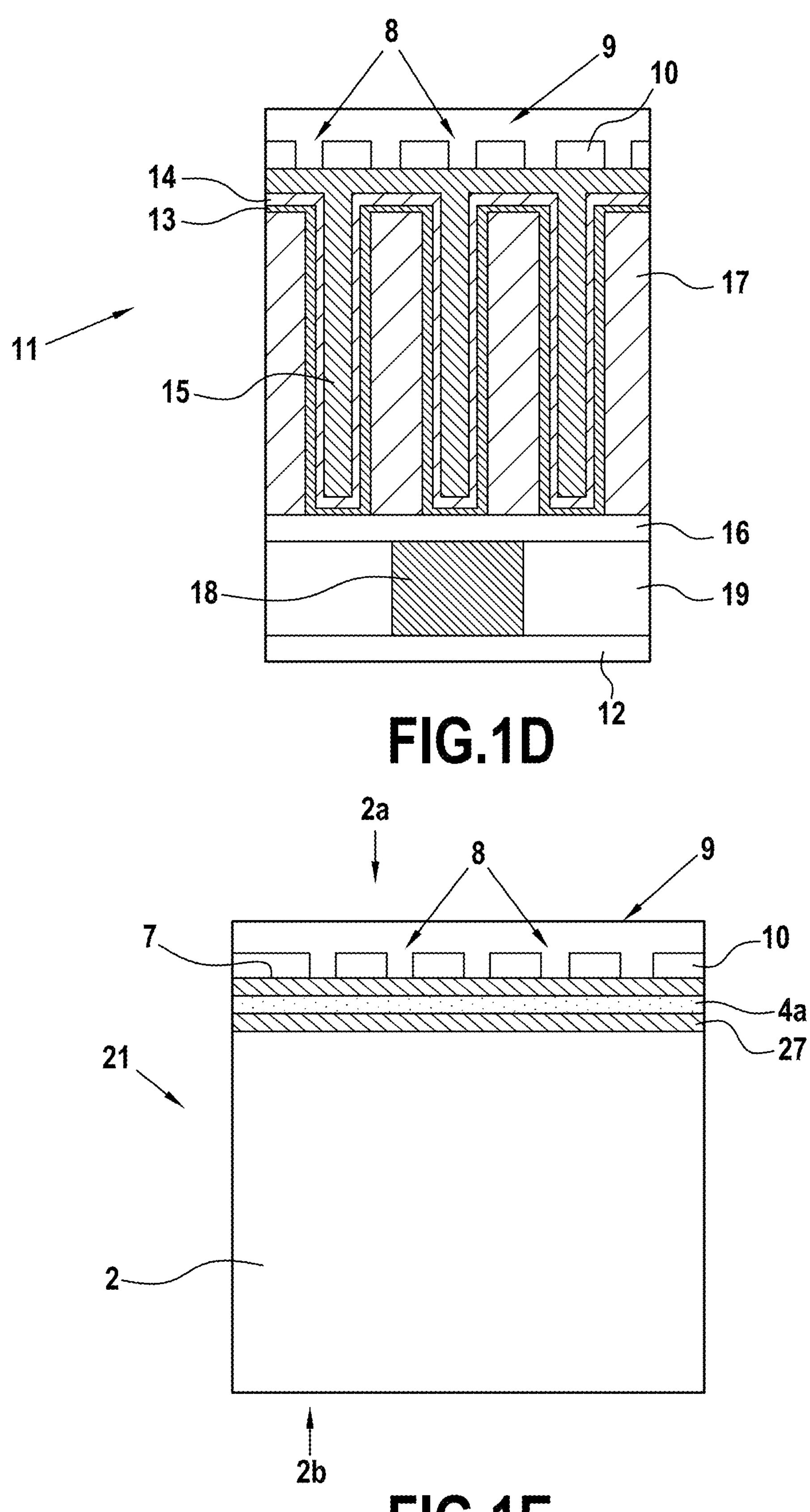
Figure 1F:
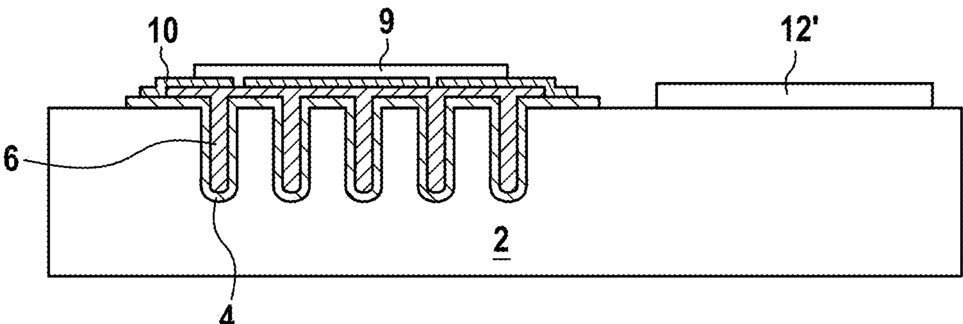
Figure 2A:
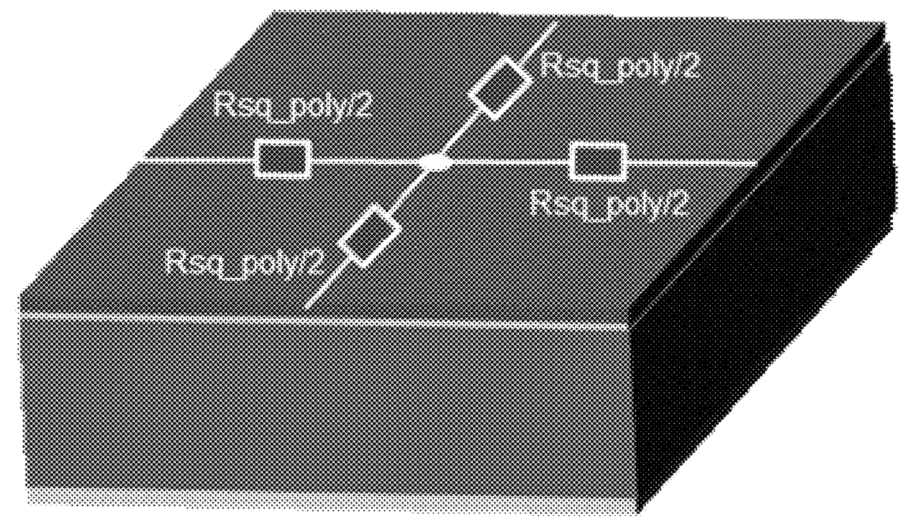
FIGS. 2A to 2C illustrate how the equivalent series resistance at the top contact of the RC-network component of FIGS. 1A-1F can be modulated by varying the number of bridging contacts between a thin-film top electrode portion of the capacitor and a contact plate.
Figure 2B:
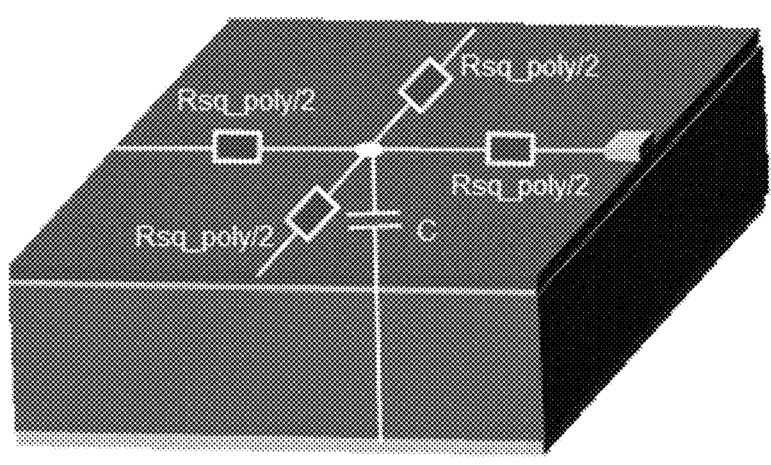
Figure 2C:
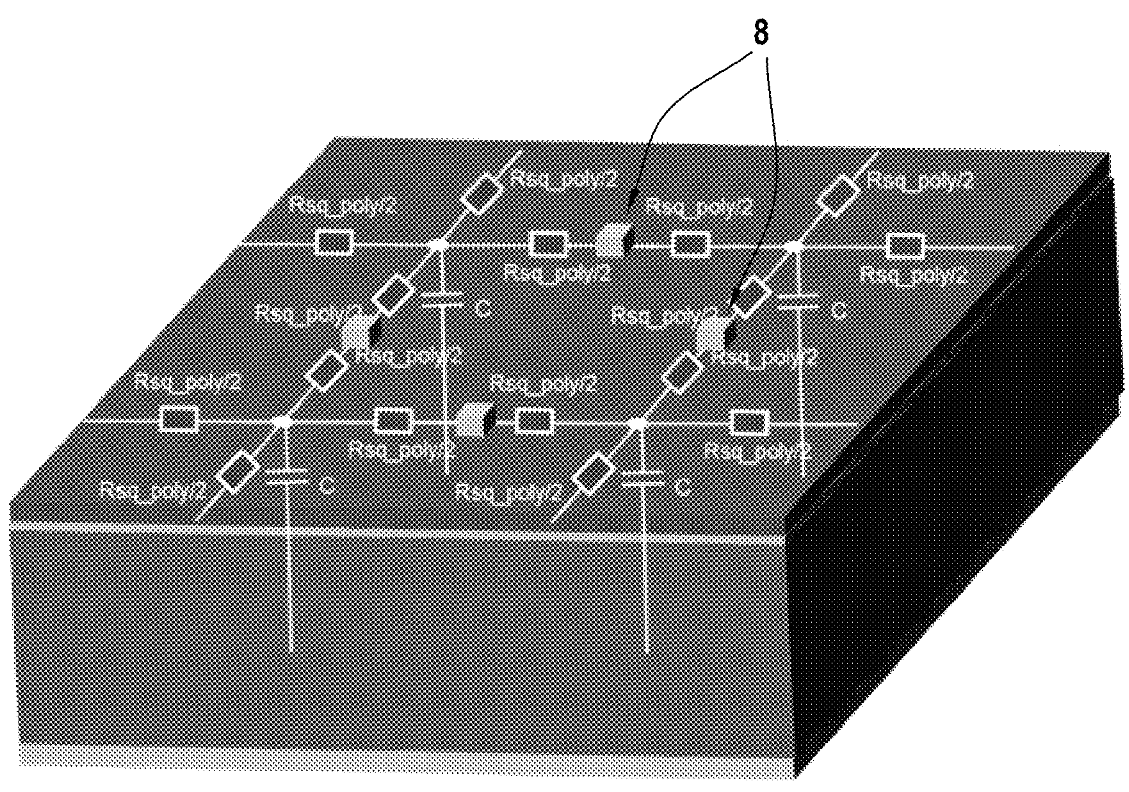

As shown in FIG. 6, the RC component 51 has the same general structure as the example component 21 illustrated in FIG. 1E. However, although the profile of the insulating layer around a first opening 11 in the insulating layer has the same form as in FIG. 1E, FIG. 6 also shows two different profiles around two other openings 111. Around a first opening 111*a*, the insulating layer 110 has a reduced-thickness portion 112*a* which produces a stepped profile around the periphery of the opening. Around a second opening 111*b*, the insulating layer 110 has a reduced-thickness portion 112*b* which tapers in the direction towards the center of the opening 111*b*. Although FIG. 6 illustrates differently-shaped profiles for the portions of the insulating layer adjacent to openings 11, 111*a* and 111*b*, in practice RC-network components according to the invention generally implement the same profile for the insulating layer portions adjacent to all of the openings, in view of simplifying the manufacturing process of the component.

Figure 7:
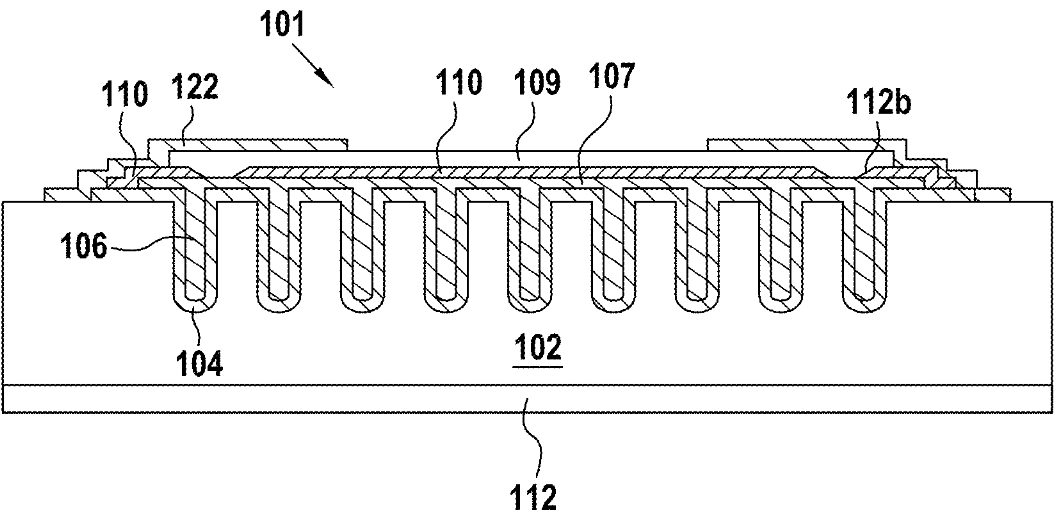
FIG. 7 is a cross-sectional view across an RC-network component according to an embodiment of the invention in which there are reduced-thickness portions of the insulating layer at the periphery of the openings for the bridging contacts, and the reduced-thickness portions have a tapering shape.

FIG. 7 illustrates an example of an RC-network component 101 according to an embodiment of the invention which implements tapering reduced-thickness portions 112*b* of the insulating layer 110 at locations adjacent to the openings 111. In the example according to FIG. 7, the RC-network component 101 is of the same general type as the component 1 illustrated in FIGS. 1A and 1*s* a monolithic RC-network component (integrated passive device (IPD)).

As can be seen from FIG. 7, the monolithic RC-network component 101 comprises a substrate 102. In the example illustrated by FIG. 7, the substrate 102 is a low ohmic semiconductor substrate which defines the bottom electrode of a MIS (metal-insulator-silicon) structure constituting a three-dimensional (3D) capacitor. The 3D capacitor structure is formed over a set of holes which extend from the surface at a first side 102*a* of the substrate 102 into the bulk of the substrate. It will be understood that, in other embodiments, the 3D capacitor structure may make use of other relief features provided in this surface of the substrate 2 (e.g. trenches, holes, columns, . . . ). It will be understood further that, in other embodiments, the capacitor may be implemented according to the different technologies illustrated in FIGS. 1D and 1F.

A continuous dielectric layer 104 is formed over the set of holes and conformally follows the contours of the surface, lining the walls of the holes. The dielectric layer 104 constitutes the dielectric of the 3D capacitor. The top electrode of the 3D capacitor is formed by a conductive material 106 which fills the holes and extends in a thin film 107 at the surface of the substrate. The thin film 107 constitutes a thin-film top electrode of the capacitor. In preferred embodiments of the invention the thickness of the layer 107 constituting the upper electrode is 5 μm or less. In more especially preferred embodiments of the invention the thickness of the layer 107 constituting the upper electrode is 1 μm or less.

A contact plate 109 is provided parallel to the layer 107 of the top capacitor electrode, separated by insulating layer 110. The contact plate 109 may be used as one terminal (top terminal) of the RC-network component 101. In the illustrated example, the contact plate 109 and the layer 107 of the top capacitor electrode have the same surface area and peripheral shape. If desired, the contact plate 109 and the layer 107 of the top capacitor can have different surface areas from one another and/or different peripheral shapes from one another.

In the RC-network component 101, a set of bridging contacts 108 are formed through the insulating layer 110 and electrically interconnect the layer 107 of the 3D capacitor electrode with the contact plate 109. The number of bridging contacts included in the set may vary between embodiments of the invention. In some embodiments of the invention a single opening/bridging contact may be provided. In other embodiments of the invention two bridging contacts may be provided. In still other embodiments of the invention, three or more than three bridging contacts/openings may be provided.

The peripheral shape of the openings in which the bridging contacts are formed can vary between different embodiments of the invention. For example, the peripheral shape of each opening may be square, rectangular, circular, elliptical, etc. In the case of using openings/bridging contacts whose peripheral shape includes sharp corners (e.g. squares) there may be a temperature concentration at the corners, so preferred embodiments of the invention use openings/bridging contacts having smooth perimeters (e.g. circles, ellipses, rectangles whose corners are rounded off, etc.).

In certain embodiments of the invention the set of bridging contacts 108 is constituted by a pair of bridging contacts 108 formed to fill openings 111*c* each having a peripheral shape generally corresponding to an elongated slot which spans substantially the full width of the thin-film top-electrode 107 of the capacitor. The slots may correspond to elongated rectangles with the corners rounded off so that there are no corners where current concentration (and, thus, heat concentration) occurs. The number of such slots is not limited to two.

A conductive layer 112 (backside metallization) is provided on the bottom surface of the substrate 102. The conductive layer 112 constitutes a bottom contact of the RC-network component 101.

In the RC-network component 101 according to the embodiment of the invention represented in FIG. 7, the 3D capacitor structure extends through the substrate in the direction of the substrate's thickness, and opposing electrodes of the 3D capacitor are accessible at opposite sides 102*a*, 102*b* of the substrate 102. The resistance of the RC-network component depends on the contact structure at side 102*a* of the RC-network component, involving the contact plate 109 and the bridging contacts 108, but there may also be a resistance contribution from the bulk substrate 102. However, the contribution made by the substrate 102 may be reduced by employing a low ohmic substrate. For example, to reduce the contribution which the substrate makes to the overall resistance, the substrate may be highly doped so as to be low ohmic. For example, N type silicon may be used having a doping level of the order of $10^{19}$ $cm^{-3}$. Semiconductor materials other than silicon may also be used, e.g. GaAs, with appropriate doping levels so that the substrate is low ohmic.

As another example, in a case where the sheet resistance is 100 Ohms per square, typically the substrate is $n^{++}$ doped so that resistivity of the substrate is set from 1 mOhm·cm to 5 mOhm·cm. Thus, the substrate does not make a significant contribution to the overall resistance of the RC network component. If the sheet resistance is increased (say, to 1 kOhm per square) then it is permissible to use a higher ohmic substrate, i.e. a substrate having a lower doping level. Preferably the doping of the substrate is set so that the substrate makes a contribution of no more than 5% (more preferably of the order of 1%) to the resistance of the RC network, while still ensuring that ohmic contact can be made with the backside metallization.

The dielectric layer 104 may be made of a material (or stack of materials) such as $SiO_2$, SiN, $Al_2O_3$, $HfO_2$, ONO, etc.

In the example illustrated in FIG. 7, the conductive material 106 used to form the top capacitor electrode and the layer 107 is polysilicon. In this case, because the final resistor in the architecture is defined by the sheet resistance of the polysilicon layer, the drift of the resistance value with temperature is the same as for a standard polysilicon process, and can be as low as a few 100 ppm/° C. Furthermore, the absolute accuracy of the resistance is the same as for a standard polysilicon process, i.e. the variation in nominal value in a batch of products can be <10%.

It will be understood that conductive materials other than polysilicon may be used to form the top capacitor electrode, for example, TiN, Si/Ge, etc.

The sheet resistance of the polysilicon top capacitor electrode can be adjusted by appropriate control of the doping of the material forming the top capacitor electrode. The sheet resistance of the top capacitor electrode can be adjusted in the same way in the case where this electrode is made of other semiconductor materials.

Typically, a thin-film capacitor-electrode portion 107 made of polysilicon has a thickness in the range from about 100 nm to about 3 μm. An example value is 1 μm.

The insulating layer 110 may be made of any convenient insulating material. In certain implementations of the invention the insulating layer 110 is made of a silicon compound such as an oxide or nitride. An example material is $SiO_2$ which is selected in view of its ubiquity and the fact that it enables an insulating layer having only moderate stress to be produced, but the invention is not limited to the use of this material. Other materials may be used, including materials such as SiN (assuming that increased stress is acceptable), and less common materials such as BCB (benzocyclobutene).

As a result of a patterning process (described below), the portions of the insulating layer 110 that are adjacent to the openings 111 are implemented as reduced-thickness portions 112*b* having a tapering shape. More specifically, in the vicinity of the openings 111, the thickness of the insulating layer 100 gradually decreases until it reaches zero at the periphery of the opening 111. The effect of this reduced-thickness portion is described below.

Typically, the insulating layer 110 has a thickness (outside the reduced-thickness portions 112) in the range from about 100 nm to about 3 μm. An example value is 1 μm.

The bridging contacts 108 may be made of any convenient conductive material. To avoid having a significant impact on the resistance of the finished component, it is advantageous for the bridging contacts to be made of a material having conductivity greater than that of the material forming the top capacitor electrode 107. In the case where the top capacitor electrode 107 is made of polysilicon, an example material that may be used for the bridging contacts is Al—Si—Cu, or aluminum (especially high purity aluminum having low granularity, which facilitates assembly), but the invention is not limited to use of these materials.

The contact plate 109 may be made of may be made of any convenient conductive material. In practice, the nature and dimensions of the plate 109 may be selected taking into account constraints that derive from the process (wire-bonding, ribbon bonding, etc.) that is used to assemble the RC-network component 101 with other components.

In a case where the contact plate 109 is made of the same material as the bridging contacts 108, both elements may be formed in a common manufacturing process, which simplifies fabrication. Also, in a case where the contact plate 109 and bridging contacts 108 are made of the same material there is an improved mechanical and electrical connection between them. The latter property is advantageous because a poor-quality contact to the underlying polysilicon could in itself introduce a contribution to the overall resistance of the component. The layer 112 may be made of one or more conductive layers, such as metals. As one example, the layer 112 may be made of a stack of Ti, Ni and Au (or Al) layers, with the Ti layer improving adhesion to the semiconductor substrate, Ni serving as a barrier layer and Au (or Al) providing good solderability of the component.

Figure 3A:
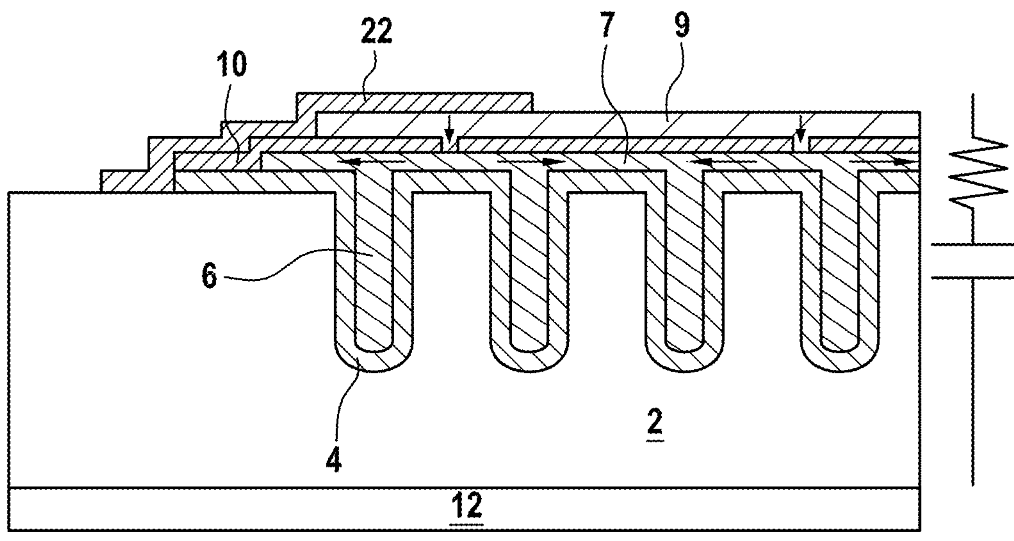
Figure 3B:
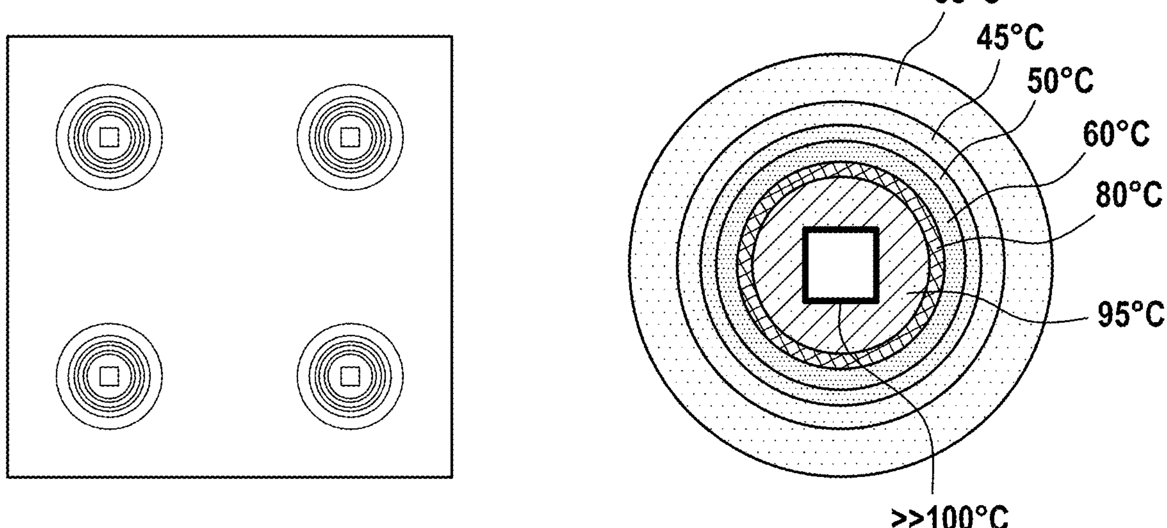

A layer 122 covering the ends of the layers 104, 110 and 109 is provided for improving moisture resistance of the structure. This layer 122 may be made of any convenient material, e.g. SiN as for layer 22 in the embodiment illustrated in FIG. 3A.

Although FIG. 7 represents an RC-network component 101 in which the insulating layer 110 has reduced-thickness portions 112*b* having a tapering shape, it will be understood that in a variant implementation the reduced-thickness portions 112*b* can be replaced by reduced-thickness portions 112*a* as illustrated in FIG. 6, that produce a stepped shape in the insulating layer 110 adjacent to the openings.

Figure 8A:
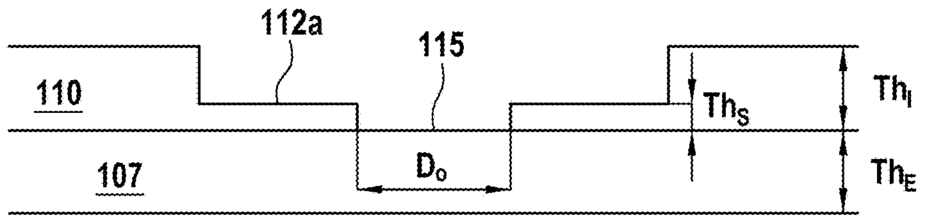
Figure 8B:
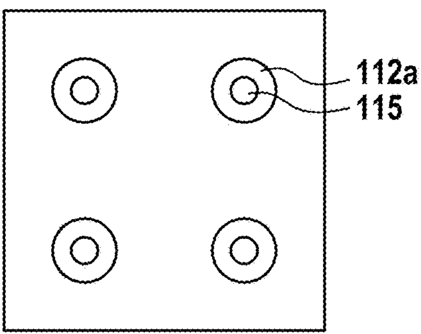
Figure 8C:
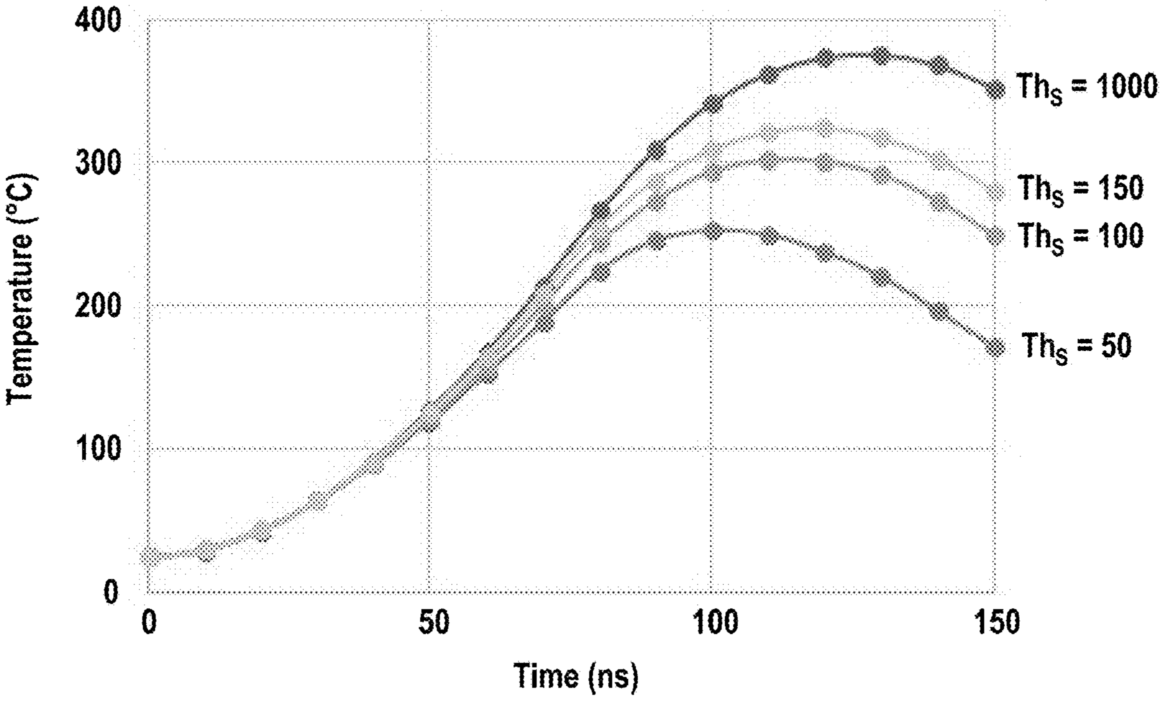

FIG. 8A-8C are diagrams for illustrating the effect of reduced-thickness portions 112*a* of the insulating layer provided at the periphery of the openings for the bridging contacts. FIG. 8A represents a cross-section through a portion of a test structure including an insulating layer having reduced-thickness portions 112*a* producing a stepped profile in the insulating layer at the periphery of openings for bridging contacts. FIG. 8B shows a top plan view of the test structure.

As illustrated in FIG. 8A, the reduced-thickness portions 112*a* each include a single plateau region where the thickness $Th_S$ of the insulating layer 110 is lower than the thickness $Th_I$ of the remainder of the insulating layer. In cases where the openings 111 are circular, the reduced-thickness portion 112*a* has an annular shape. The reduced-thickness portion surrounds the periphery of the opening 111 where there is a region 115, having diameter $D_O$, where the thin-film capacitor-electrode portion 107 is not overlain by the insulating layer 110. The reduced-thickness portion 112*a* extends over a first distance R from the periphery of the opening outwards. Beyond the first distance R, the insulating layer 110 has a substantially constant thickness.

Figure 4A:
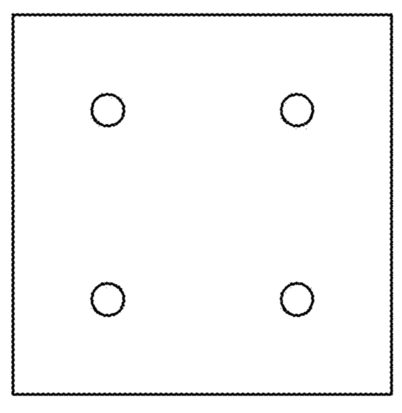
Figure 4B:
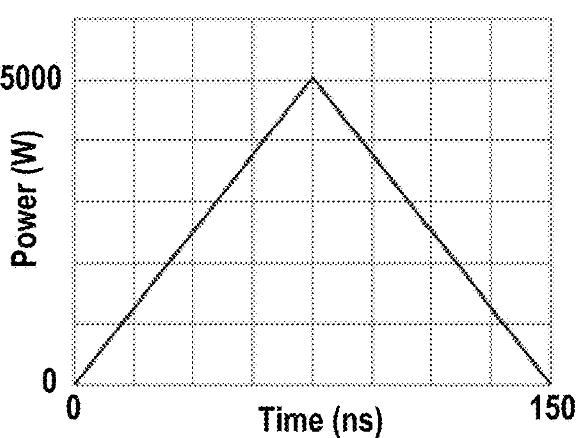
Figure 5A:
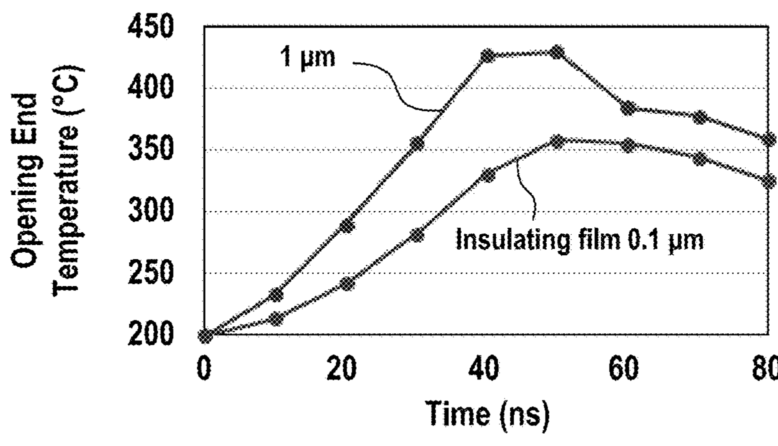
Figure 5B:
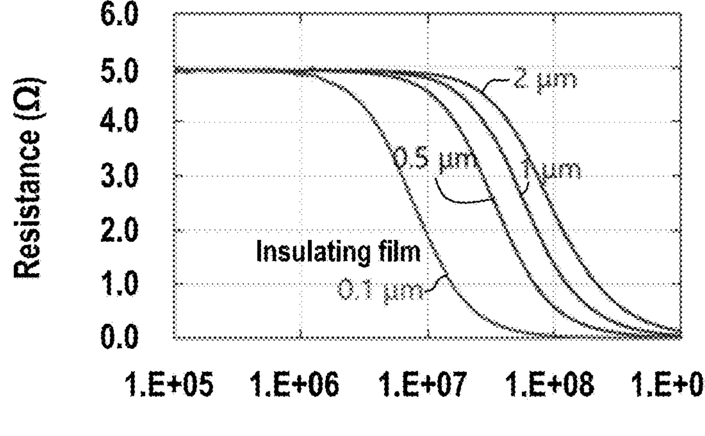

FIG. 8B shows that, as in the example of FIG. 4A also in the present simulations the test structure has four circular bridging contacts/openings in the insulating layer. In the simulations, the test structure included a lower layer (corresponding to the thin-film top electrode portion) made of polysilicon and having a thickness $Th_E$ of 840 nm, connected to a metal upper plate by a set of four bridging contacts each having a diameter of 120 through an insulating layer made of $SiO_2$. The thickness $Th_1$ of the insulating layer was 1 μm at the portions thereof outside the reduced-thickness portions 112*a*. In cases where there is a slight lack of uniformity in the thickness of the insulating layer outside the reduced-thickness regions, $Th_1$ refers to the average thickness of the insulating layer outside the reduced-thickness regions.

FIG. 8C is a graph of simulation results showing how the temperature developed at the periphery of openings in the test structure of FIG. 8B changed over time upon application of a voltage pulse in four example cases where the height $Th_S$ of the reduced-thickness portions 112*a* was set to four different values (expressed in nm in FIG. 8C). It can be seen from FIG. 8C that the highest temperature was developed at the periphery of the openings in the case where $Th_S$=1000 nm (i.e. the same thickness as the rest of the insulating layer such that no reduced-thickness portion 112*a* was present). It can also be seen that the peak temperature reduces as the height of the reduced-thickness portion 112*a* decreases. In presently-preferred embodiments of the invention, the height $Th_S$ is in the range of approximately 5% to approximately 20% of the $Th_1$ in view of preserving a desired resistance value for the overall component while limiting the peak temperature.

Figure 12A:
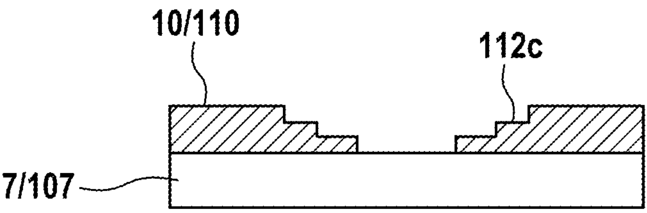

The drawings illustrate the case where a stepped profile is produced in the insulating layer 110 adjacent to the openings 111 by reduced-thickness portions 112*a* including a single plateau region. However, the invention is not limited to this configuration, the reduced-thickness portion 112*a* may include two plateau regions, having different heights, reducing in the direction towards the center of the opening 111, or more than two plateau regions, so that the stepped profile at in the insulating layer resembles a staircase including two or more than two steps. FIG. 12A illustrates an example of a reduced-thickness portion 112*d* of such a type.

Figure 9A:
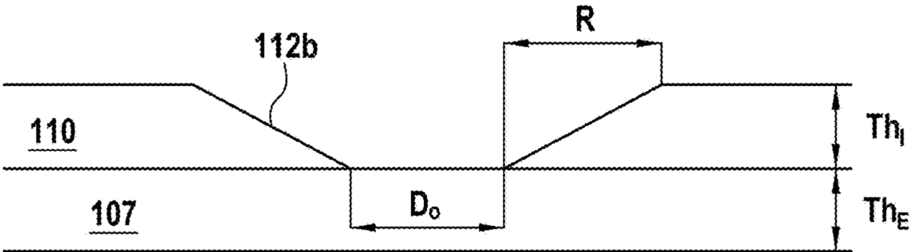
Figure 9B:
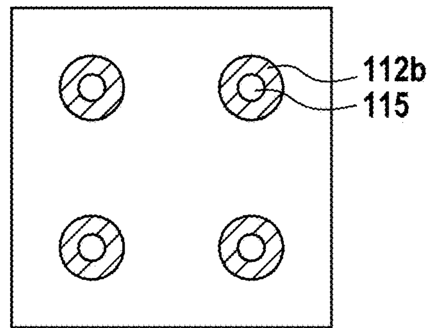
Figure 9C:
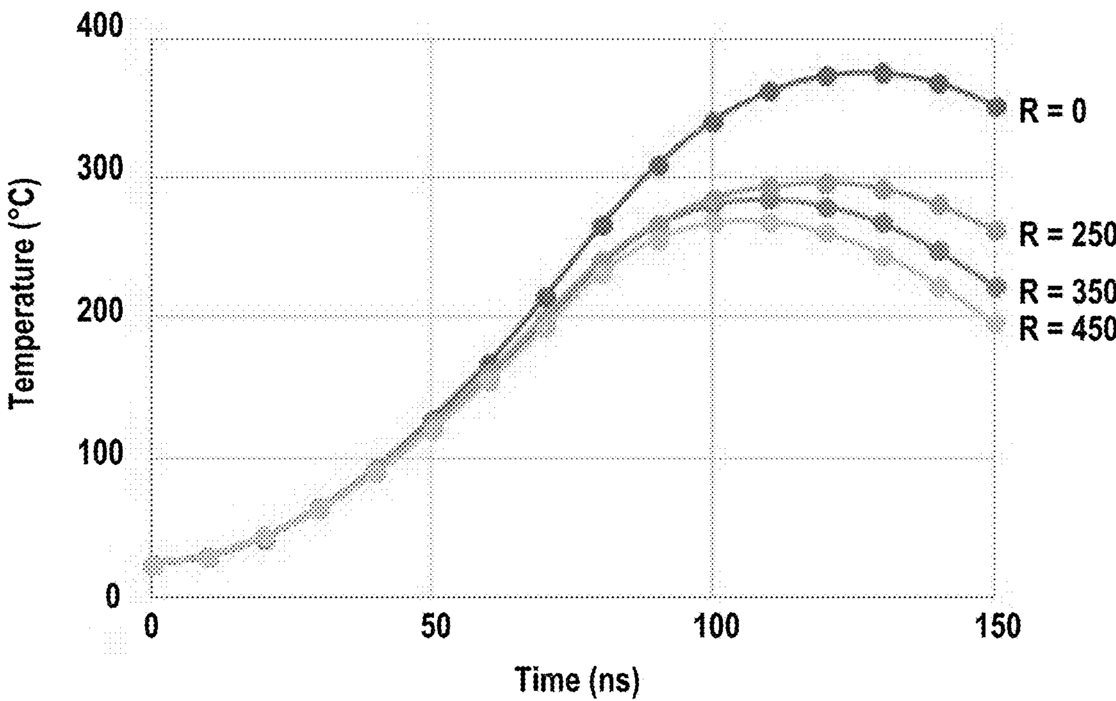

FIG. 9A-9C are diagrams for illustrating the effect of the tapering reduced-thickness portions 112*b* of the insulating layer provided at the periphery of the openings for the bridging contacts. FIG. 9A represents a cross-section through a portion of a test structure including an insulating layer having tapering reduced-thickness portions 112*b* at the periphery of openings for bridging contacts and FIG. 9B shows a top plan view of the test structure.

As illustrated in FIG. 9A, the reduced-thickness portions 112*b* each taper in the direction towards the center of the opening. FIG. 98 shows that the test structure has the same overall configuration as that of FIG. 8B except that the shape of the reduced-thickness portions is changed. Except where stated, the materials and dimensions of the layers in the test structure of FIG. 9B were the same as those of the test structure shown in FIG. 8B.

FIG. 9C is a graph of simulation results showing how the temperature developed at the periphery of openings in the test structure of FIG. 9B changed over time upon application of a voltage pulse in four example cases where the distance R over which the reduced-thickness portions 112*b* tapered was set to four different values (expressed in nm in FIG. 9C). It can be seen from FIG. 9C that the highest temperature was developed at the periphery of the openings in the case where R=0 nm (i.e. there was no tapering portion 112*b*). It can also be seen that the peak temperature reduces as the distance R over which the tapering occurs becomes longer. In general, it has been found that the peak temperature can be reduced whenever R is non-zero.

An example implementation of a method for fabricating an RC-network component 101 such as that of FIG. 7 will now be described with reference to FIGS. 10 and 11.

Figure 10:
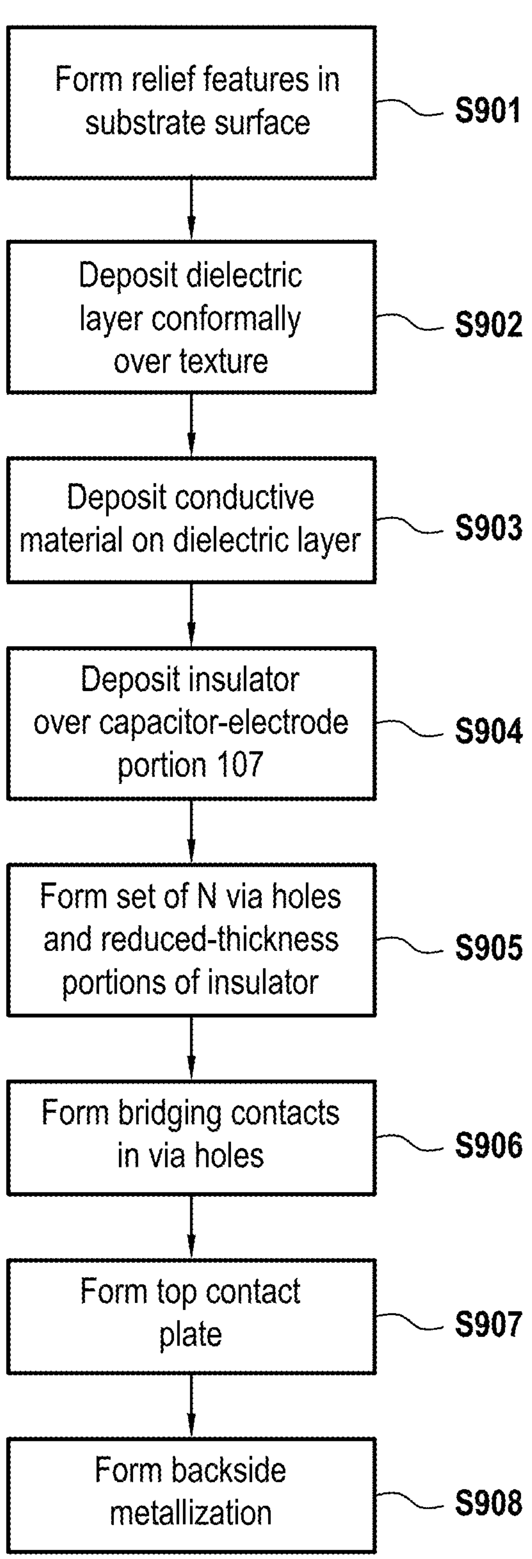
FIG. 10 is a flow diagram illustrating an example method of manufacturing an RC-network component such as that illustrated in FIG. 6B.
Figure 11:
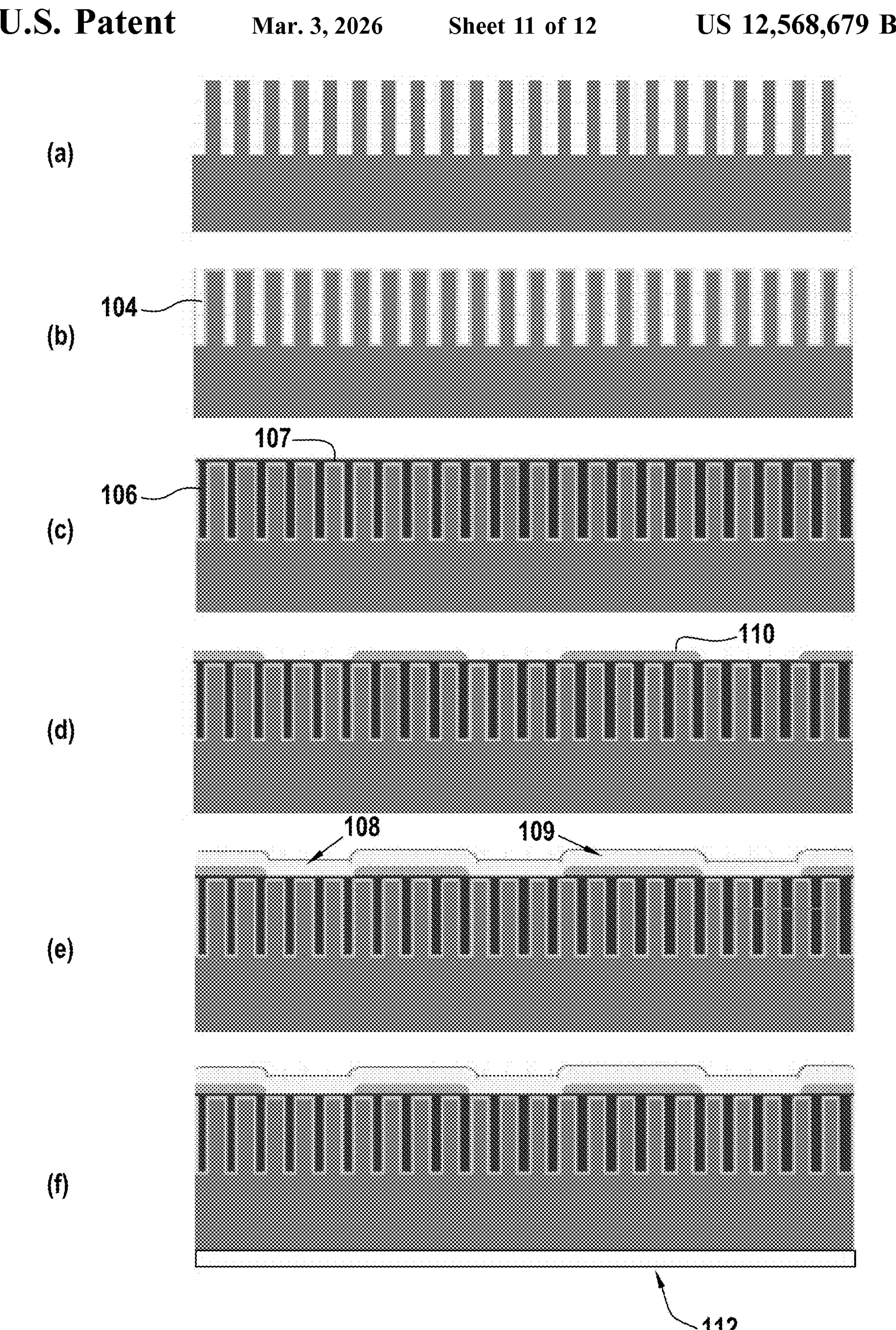
FIG. 11 shows a series of views illustrating the steps of FIG. 10.

It is assumed that a suitably-prepared semiconductor substrate is provided at the start of the method illustrated by FIG. 10. This may be, for example, a low-ohmic (highly-doped) silicon wafer in which multiple RC-network components according to the invention will be fabricated simultaneously. For simplicity, the following description only discusses formation of a single RC-network component intended to be a standalone component. Conventional processes may be used to form the elements of the MIS capacitor structure.

A set of adjacent relief features (e.g. holes, trenches or columns) is created in a surface of the substrate 102 (step S901). The relief features may be created, for example, using masking and etching processes, e.g. DRIE (deep reactive ion etching). Diagram (a) of FIG. 11 represents the substrate after creation of relief features consisting of a set of wells (trenches, holes). Then, dielectric material (e.g. $SiO_2$) is deposited, for example by chemical vapour deposition, atomic layer deposition, etc., and patterned by photolithography and dry etching so as to form the dielectric layer 104 that covers the relief features substantially conformally (step S902). Diagram (b) of FIG. 11 represents the substrate after formation of the dielectric layer 104.

Next, conductive material (e.g. polysilicon) is deposited over the dielectric layer 104, for example by a chemical vapour deposition process, and patterned by photolithography and dry etching so as to form the portion 106 and the thin-film top electrode portion 107 (step S903). Diagram (c) of FIG. 11 represents the substrate after formation of the portions 106 and 107.

An insulating layer 110 is then formed on the capacitor-electrode portion 107 (S504), for example by depositing a layer of $SiO_2$ by a plasma enhanced chemical vapor deposition process, or any other convenient process. A patterning process may then be used (step S905) to create a set of via holes (openings) in the insulating layer. Typically, the patterning process involves photolithography to define the openings 111, followed by dry etching in one or more etching processes so that tapered reduced-thickness portions 112*b* (or steps 112*a*) are formed in the insulating layer adjacent to the periphery of the openings. Diagram (d) of FIG. 11 represents the structure after the insulating layer 110 has been formed and the via holes created.

Next, a set of bridging contacts are formed in the via holes (S906), notably by filling the via holes with a conductive material, e.g. Al, Al—Si—Cu, etc. The conductive material may be deposited by any convenient process, e.g. sputtering, CVD, PVD, etc. A contact plate 109 is then formed on the insulating layer (S907), for example by PVD. The contact plate 109 is electrically connected to the capacitor-electrode portion 107 by the bridging contacts. Diagram (e) of FIG. 11 represents the structure after the bridging contacts and contact plate have been formed. Although FIG. 10 shows the formation of the bridging contacts 108 and the formation of the contact plate 109 as separate processes, it should be noted that these elements may all be formed in a common process.

Finally, the backside of the wafer is ground and a backside electrode 112 is formed on the surface of the substrate opposite to the surface upon which the contact plate 109 is formed (S908). Conventional processes may be used to create the backside metallization. The backside electrode 112 may be made of any convenient material or materials, e.g. a 3-layer structure consisting of Ti/Ni/Au. Diagram (f) of FIG. 11 represents the structure after the backside electrode has been formed. In practice, additional steps may be required, e.g. planarization, dicing the wafer to singulate individual dies, and so on.

Additional Variants

Although the present invention has been described above with reference to certain specific embodiments, it will be understood that the invention is not limited by the particularities of the specific embodiments. Numerous variations, modifications and developments may be made in the above-described embodiments within the scope of the appended claims.

Thus, for instance, although the embodiments described in detail above involve use of reduced-thickness portions of the insulating layer having a single-step shape or a tapering shape, it is to be understood that other shapes may be used. A multi-step structure has already been mentioned above (see FIG. 12A). Some additional examples of various other possible shapes are illustrated in FIGS. 12B to 12D.

It may be difficult to fabricate reduced-thickness portions as illustrated in FIG. 9A, which taper continuously all the way down to reach a zero thickness of the insulating layer at the periphery of the openings. In practice, the tapering reduced-thickness portion may have a truncated shape, as illustrated in the reduced-thickness portion 112*d* in FIG. 12B, such that there is a certain thickness of the insulating layer even at the periphery of the openings.

Moreover, it may be difficult to achieve a linear profile as the thickness of the tapering reduced-thickness portion 112*b* of FIG. 9A reduces towards the periphery of the openings. In practice, a curved profile may be produced taking the form, for example, of reduced-thickness portion 112*e* illustrated in FIG. 12C having a concavely-curving profile as indicated by arrow C, and a hollowed-out, or undercut, region indicated by arrow H in FIG. 12C. This kind of shape may be produced when isotropic etching is used to form the openings through the insulating layer 10/110.

Figure 12B:
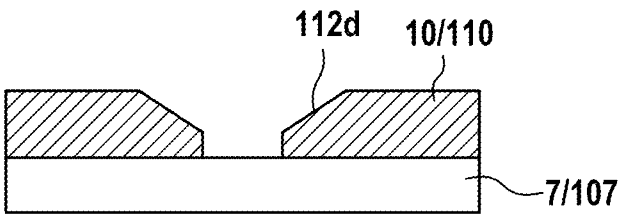
Figure 12C:
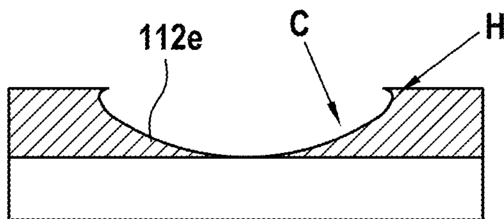
Figure 12D:
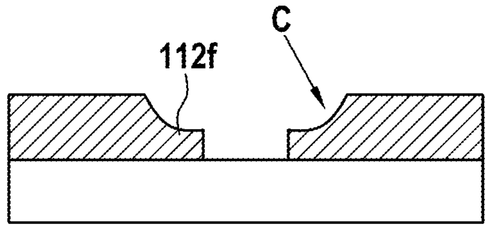
FIG. 12D illustrates reduced-thickness portions having a truncated tapering shape with a concavely-curved profile.

Likewise, it may be difficult to achieve a linear profile as the thickness of the truncated, tapering reduced-thickness portion 112*d* of FIG. 12B reduces towards the periphery of the openings. In practice, a curved profile may be produced taking the form, for example, of reduced-thickness portion 112*f* illustrated in FIG. 12D, having a concavely-curving profile as indicated by arrow C. This kind of shape may be produced when a combination of anisotropic etching and isotropic etching is used to form the openings through the insulating layer 10/110.

Additional shapes for the reduced-thickness portions, besides those illustrated in the figures, are also possible. For example, the profile of the reduced-thickness portion may be a combination of shapes (e.g. combining one or more curved, stepped, straight and/or tapered segments).

It is to be understood that references in this text to directions and locations, such as "top" and "bottom", merely refer to the directions that apply when architectures and components are oriented as illustrated in the accompanying drawings. Thus, a surface which may be "top" in FIG. 1A would be closest to the ground if the component 1 were to be turned upside down from the illustrated orientation.

The invention claimed is:

1. An integrated RC-network component comprising:
- a substrate;
- a capacitor having a thin-film top electrode portion at a surface on a first side of the substrate;
- an insulating layer on the thin-film top electrode portion of the capacitor;
- a contact plate on the insulating layer; and
- one or more bridging contacts in openings traversing the insulating layer, the bridging contacts electrically connecting the thin-film top electrode portion of the capacitor to the contact plate,
- wherein the substrate is a low ohmic semiconductor substrate doped to make a contribution of no more than 5% to a resistance of the RC-network component,
- in a direction of a thickness of the thin-film top electrode portion of the capacitor, a length of the bridging contacts is sufficiently greater than the thickness of the thin-film top electrode portion that an equivalent series resistance of the capacitor is proportional to a sheet resistance of the thin-film top electrode portion divided by a number of bridging contacts, and
- the insulating layer comprises reduced-thickness portions located around perimeters of the openings, and in the reduced-thickness portions the thickness of insulating material provided on the thin-film top electrode portion is lower than the thickness of a remainder of the insulating layer.

2. The RC-network component according to claim 1, wherein the insulating layer has a stepped shape at a periphery of the openings due to the reduced-thickness portions.

3. The RC-network component according to claim 1, wherein the reduced-thickness portions have a tapered shape.

4. The RC-network component according to claim 3, wherein the reduced-thickness portions have a truncated tapered profile or a curved profile.

5. The RC-network component according to claim 1, wherein the thickness of the thin-film top electrode portion is less than 5 μm.

6. The RC-network component according to claim 1, wherein the insulating layer is made of a silicon compound.

7. The RC-network component according to claim 1, wherein the bridging contacts are made of a material having conductivity greater than that of the material forming the top capacitor electrode.

8. The RC-network component according to claim 1, wherein the bridging contacts and the contact plate are an integral same material.

9. The RC-network component according to claim 1, wherein the thin-film top electrode portion of the capacitor is made of polysilicon.

10. The RC-network component according to claim 1, wherein the RC-network component has first and second contacts provided, respectively, at said first side of the substrate and at a second side of the substrate opposite to said first side, the first contact comprises said contact plate, and a series RC circuit is constituted between the first and second contacts.

11. The RC-network component according to claim 10, wherein the capacitor is a 3D capacitor, and a bottom electrode of the 3D capacitor is constituted by the low ohmic semiconductor substrate.

12. The RC-network component according to claim 1, wherein an only part of the capacitor top electrode to be located at said surface on the first side of the substrate is a single planar sheet constituting said thin-film top electrode portion.

13. A monolithic RC-network component comprising the RC-network component according to claim 1.

14. A method of fabricating an RC-network component, the method comprising:

forming a capacitor having a thin-film top electrode portion at a surface on a first side of a substrate;

forming an insulating layer on the thin-film electrode portion of the capacitor;

forming one or more bridging contacts traversing openings in the insulating layer; and forming a plate-shaped contact on the insulating layer, wherein said bridging contacts electrically connect the thin-film top electrode portion of the capacitor to the plate-shaped contact, the substrate is a low ohmic semiconductor substrate doped to make a contribution of no more than 5% to a resistance of the RC-network component, in a direction of a thickness of the thin-film top electrode portion of the capacitor, a length of the bridging contacts is sufficiently greater than the thickness of the thin-film top electrode portion that an equivalent series resistance of the capacitor is proportional to a sheet resistance of the thin-film top electrode portion divided by a number of bridging contacts, and the insulating layer comprises reduced-thickness portions located around perimeters of the openings, and in the reduced-thickness portions the thickness of insulating material provided on the thin-film top electrode portion is lower than the thickness of a remainder of the insulating layer.

* * * * *